United States Patent [19]

Schwarz

[11] Patent Number: 5,025,285
[45] Date of Patent: Jun. 18, 1991

[54] APPARATUS AND METHOD FOR SHADOW MOIRE MAPPING

[75] Inventor: Robert C. Schwarz, Dix Hills, N.Y.

[73] Assignee: Grumman Aerospace Corporation, Bethpage, N.Y.

[21] Appl. No.: 349,722

[22] Filed: May 10, 1989

[51] Int. Cl.⁵ .............................................. G03B 27/32
[52] U.S. Cl. ...................................... 355/77; 356/374; 356/376
[58] Field of Search ................... 355/77; 356/374, 376

[56] References Cited

U.S. PATENT DOCUMENTS

| | | |
|---|---|---|
| 3,604,813 | 9/1971 | Kronnig . |
| 3,614,237 | 10/1971 | Kyle . |
| 3,627,427 | 12/1971 | Johnson . |
| 3,664,739 | 5/1972 | Pryor . |
| 3,762,818 | 10/1973 | Johnson et al. . |
| 3,767,308 | 10/1973 | Duffy . |
| 3,833,303 | 9/1974 | Burns et al. . |
| 3,858,981 | 1/1975 | Jaerisch et al. . |
| 4,025,197 | 5/1977 | Thompson . |
| 4,079,252 | 3/1978 | Brake . |
| 4,102,578 | 7/1978 | Suzuki et al. . |
| 4,202,630 | 5/1980 | Suzuki et al. . |
| 4,349,277 | 9/1982 | Mundy et al. . |
| 4,443,705 | 4/1984 | DiMatteo et al. . |
| 4,452,534 | 6/1984 | Gribanov et al. . |
| 4,459,027 | 7/1984 | Kafri et al. . |
| 4,480,919 | 11/1984 | Asano et al. . |
| 4,600,304 | 7/1986 | Kafri et al. . |

OTHER PUBLICATIONS

Horsch, et al., "A Moire Fringe Data Handling System for Application in an Industrial Laboratory", VDI-Berichte Nr. 313, 1978, pp. 135-141.

Schwarz, "Determination of Out-of-Plane Displacements and the Initiation of Buckling in Composite Structural Elements", Proceedings of the 1987 SEM Spring Conference on Experimental Mechanics, Jun. 14-19, 1987, Houston, Texas.

Primary Examiner—Monroe H. Hayes
Attorney, Agent, or Firm—Pollock, VandeSande & Priddy

[57] ABSTRACT

A shadow Moire grille may be inexpensively produced by enlarging the lines of a master grille on an adjacently positioned photoreproduction MYLAR strip. By varying the ratio of magnification, the line density on the MYLAR strip may be quickly and accurately created. The created MYLAR grille is then vertically positioned against an abutting glass plate; and by evacuating the space therebetween, the MYLAR grille will maintain a vertical planar orientation as needed in a shadow Moire set-up.

5 Claims, 2 Drawing Sheets

APPARATUS AND METHOD FOR SHADOW MOIRE MAPPING

FIELD OF THE INVENTION

The present invention relates to the shadow Moire method of detecting out-of-plane displacements, and more particularly to a method and apparatus for fabricating an inexpensive grille for utilization with such a method, the grille having the necessary lines formed thereon to produce the necessary sensitivity for accurate surface mapping.

BACKGROUND OF THE INVENTION

In a number of industries, it is highly desirable to determine and map the out-of-plane displacements of structural elements during loading. In the aircraft industry it is traditional to predict buckling failures in composite structures by employing empirical techniques. Predictions have been based on finite element analysis and a large number of failing load tests performed on stiffened shear panels, compression panels, and beams in universal test machines. The tests have provided very little information on the deformation of the structures as a function of applied load magnitude Analysts and designers have had virtually no test correlation of any parameter except failing load. The Moire method has been employed to map surface contours and therefore is applicable to investigating the problem of buckling of stiffened composite elements. More particularly, the Moire method has been utilized to determine out-of-plane displacements, the initiation of buckling, and the number and shape of the buckling nodes. The advantage of the Moire method is the ability of an investigator to create a full field contour map of the surface being viewed.

In the past the grilles necessary to create Moire fringes have been traditionally fabricated from optically flat plates having precisely etched lines formed therein. This involves substantial expense

BRIEF DESCRIPTION OF THE INVENTION

The present invention replaces the traditional expensive glass grille with photoreproduction MYLAR. The flexible MYLAR is initially retained against a plate glass plane. Instead of contact printing the grille lines onto the MYLAR from a master grille, the present invention offers tremendous flexibility by employing a master grille having precisely formed lines etched thereon and a photoenlargement apparatus which mounts the photoreproduction MYLAR at a variable distance relative to the master grille so that different line densities may be obtained for the MYLAR, as dictated by a desired sensitivity for a particular Moire test set-up. Accordingly, with the present invention, different photoreproduction MYLAR grilles may be quickly and inexpensively produced with the line density being "custom designed." This is highly desirable when different structural members are being investigated and wherein the various structures have quite different out-of-plane surface displacements. The sensitivity of the grille must be selected to match the degree of out-of-plane displacement. As will be appreciated, when testing different types of structural members of an aircraft, the ability to quickly produce an appropriate grille line density at a low cost is extremely advantageous Further, by employing grilles formed on MYLAR, a number of strips may be easily taped together to enable the investigation of large structural members

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
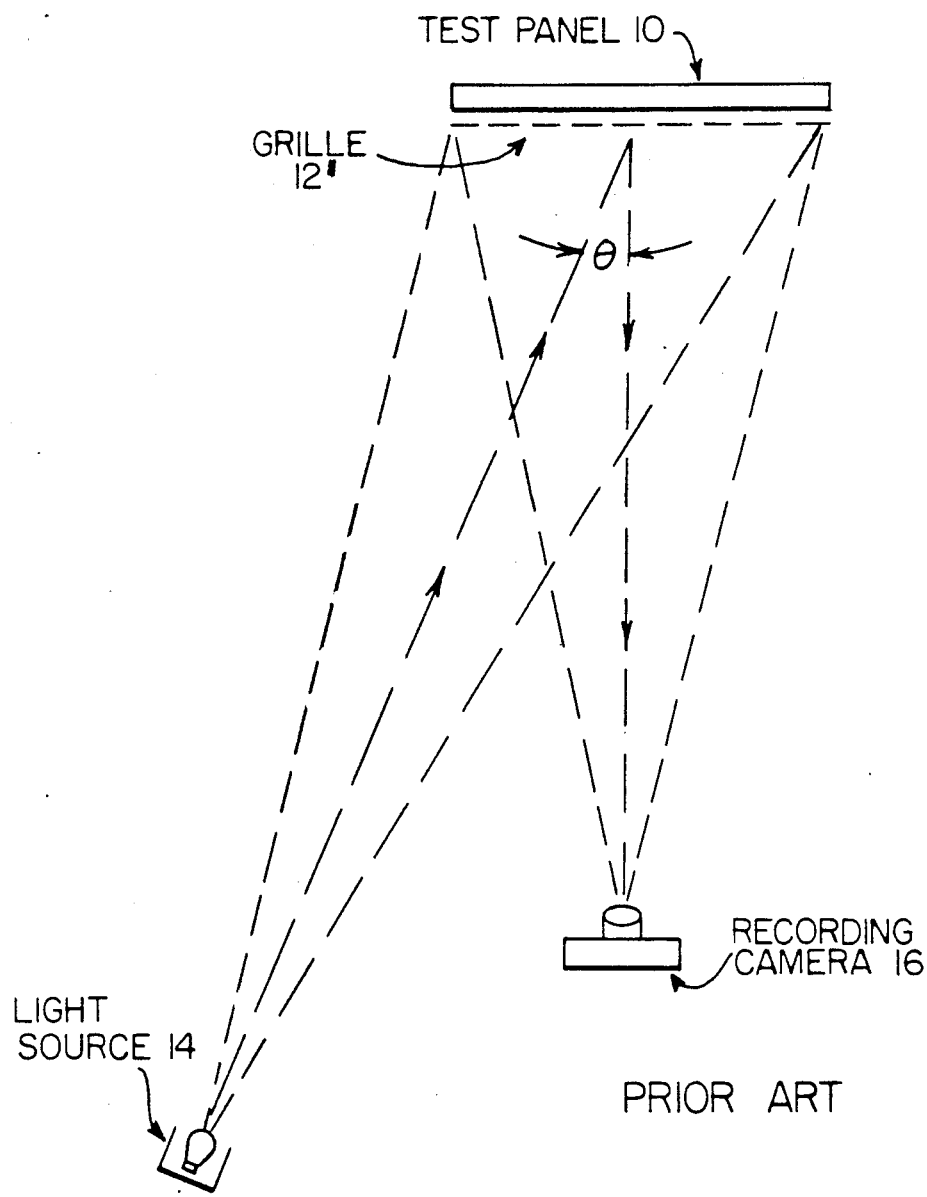
FIG. 1 is a schematic illustration of a prior art shadow Moire method set-up.

FIG. 1 illustrates a basic shadow Moire method setup. Typically, a uniformly spaced line ruling or grille 12' is dimensioned to be larger than the area of a test panel 10 to be mapped. The grille is mounted as close as possible to the front surface of the test panel while allowing displacement of the panel to occur under load. The grille is adjusted to be parallel to the largest percentage of the surface of the panel 10. A recording camera 16 is set up to view the test panel 10 through the grille 12' with its optic axis normal to the grille/test panel surface. A light source 14 is positioned so that the line between it and the center of the confronting test panel surface and the optic axis of the camera form a plane, with the lines of the grille 12' being normal to this plane. This method relies on the shadows of the grille lines interfering with the grille lines themselves to produce fringes known as the Moire effect. The advantage of this method is that all observers standing in the vicinity of the recording camera 16 can see the displacement fringes in real time.

In a typical set-up, the recording camera is of a standard type, such as the single lens reflex camera. Successful tests have been run with Kodak 2475 film for high contrast in a reduced-light situation. To simplify data reduction the camera may be placed at the same height as a test surface and normal to it.

Figure 2:
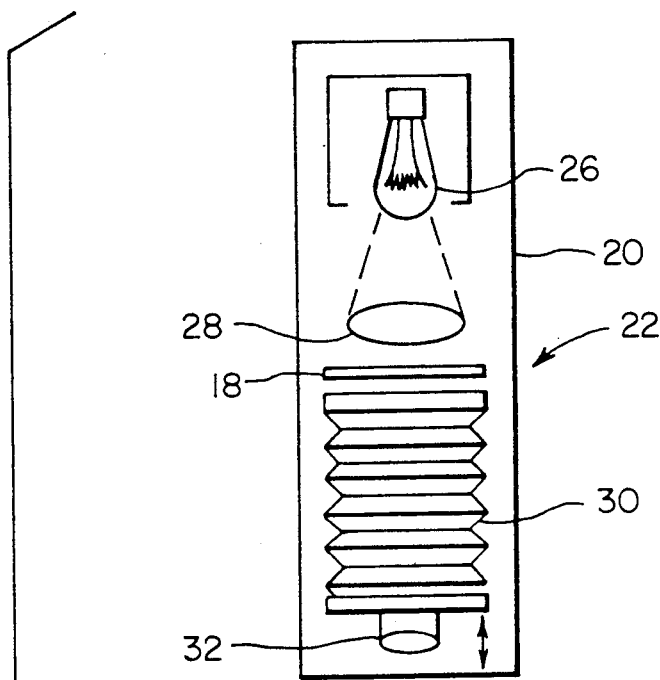
FIG. 2 is a schematic representation of the present invention illustrating an apparatus for producing a photoreproduction MYLAR of selected line density.

As mentioned previously the cost of large grilles is quite high when they are fabricated from high quality glass with precisely formed grille lines etched therein This situation increases the complexity of investigating large structural panels of aircraft. In order to ameliorate the cost and complexity situation, the present invention envisages the utilization of photoreproduction MYLAR to contain a grille line pattern. By virtue of the apparatus schematically illustrated in FIG. 2, a MYLAR grille may be quickly and inexpensively fabricated with a selected line density by employing a master grille as a standard of reference. Referring to FIG. 2, a photoreproductive MYLAR strip 12 is seen to be positioned on top of a supporting table 24. A master grille 18 of the traditional type is used as a standard of reference for all MYLAR strip grilles 12 which are to be produced by the apparatus illustrated in FIG. 2. Typically, the master grille 18 includes a grille pattern of 500 lines per inch. An enlargement or magnification ratio of 10:1 is typical so that the optics within housing 20 of the photoreproduction station 22 can produce a line image on the photoreproduction MYLAR strip grille having 50 lines per inch. After exposure the MYLAR strip is developed so that the image becomes fixed Thus, the apparatus of FIG. 2 enables a small optically precise master grille 18 to be used in the fabrication of a much larger grille 12 which will subsequently be used as the grille 12 to investigate a large structural test panel 10 is a typical shadow Moire set-up (FIG. 1).

The photoreproduction station 22 includes a light source 26 which directs a beam of light through a collimator lens 28. The projected light from source 26 then passes through the master grille 18 and then passes through the adjustably positioned lens 32 mounted to an adjustable photoenlargement structure such as bellows 30. It is to be emphasized that the particular photoenlargement optics employed within photoreproduction station is not critical and may be of various types employed in producing large graphic enlargements. One example of this type of apparatus is an enlargement apparatus employed in the production of blueprints from small image media such as microfilm. Such graphic enlargement means produces a variable line density grille on a photoreproduction mylar strip which can then be used as a "custom-made" grille 12 capable of rendering the image sensitivity necessary at a recording camera 16 (FIG. 1) which will make the Moire fringe pattern of a particular reflecting test panel surface quite readable.

Figure 3:
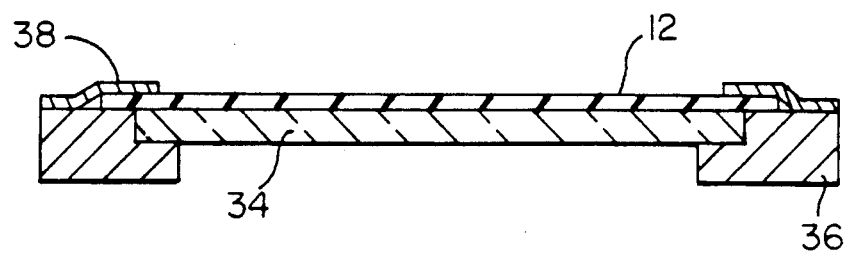
FIG. 3 is a sectional view illustrating the inventively creative MYLAR grille of the present invention against a plate glass used as a grille in the set-up of FIG. 1.
Figure 4:
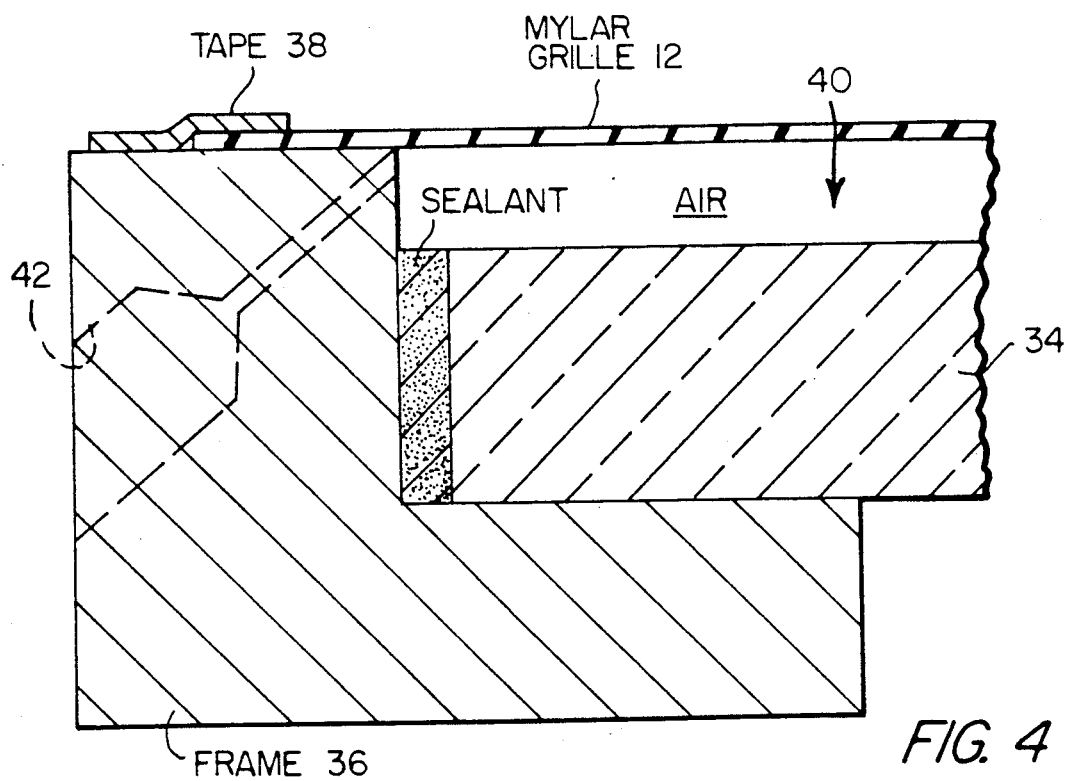
FIG. 4 is a partial sectional view illustrating the detail of FIG. 3.

FIGS. 3 and 4 illustrate the means for supporting a flexible MYLAR grille 12, in a stable position immediately adjacent a test panel 10, as shown in FIG. 1. FIG. 3 shows the overall supporting device to include a metal frame 36 which receives a glass plate 34, typically ¼ inch thick and of the quality used in window glass. The MYLAR strip grille 12 is positioned against the glass plate 34 and peripherally taped to the plate 34 by removable tape 38, such as electrical tape. In FIG. 1, a conventional grille 12' would normally be positioned in a vertical orientation. Since the MYLAR grille 12 will not normally lay flat against the plate 34, in order for the grille 12 to be used in lieu of the conventional grille 12', a vacuum is introduced in the space between the MYLAR grille 12 and the glass plate 34 thus forcing the MYLAR grille 12 in intimate abutting relationship with the flat confronting surface of the glass plate 34.

The evacuation means is clearly indicated in FIG. 4. The glass plate 34 is seen to be sealed to the frame 36 by means of a suitable adhesive such as the sealant commercially known as RTV sealant. An opening 42 is formed in frame 36 and communicates with a point near the top of frame 36 so that any air trapped in space 40 between the MYLAR grille 12 and the glass plate 34 may be evacuated thereby causing the flexible MYLAR strip to lay against the confronting surface of glass plate 34. Accordingly, as long as the vacuum is applied, the MYLAR grille 12 may be maintained in a vertical position, in lieu of a conventional grille 12', with the assurance that it is planar.

In the Moire set-up shown in FIG. 1, the light source is positioned a sufficient distance from the grille to minimize distortions in fringe sensitivity. Typically, an incident angle theta, which is the angle of illumination, may be approximately 35° and sensitivities approximating 0.030 inch per fringe may be realized.

If the test panel 10 is to undergo loading by shear forces to create buckling of the test panel, the image at the recording camera 16 will produce correspondingly altering fringe patterns that will map the out-of-plane displacement of the reflecting surface of test panel 10 as a continuous full field observation. As will be appreciated, the present invention allows different grilles 12, of varying line densities to be quickly made and installed in the set-up shown in FIG. 1, the different sensitivities being necessary to accommodate different out-of-plane initial displacements of the reflecting surface of test panel 10.

Once the contour mapping of the test panel surface is photographed with resultant Moire fringe patterns, they are analyzed in accordance with techniques well known in the prior art and which do not, per se, form part of the present invention.

It should be understood that the invention is not limited to the exact details of construction shown and described herein for obvious modifications will occur to persons skilled in the art.

I claim:

1. In a shadow Moire method for mapping plane displacement of an investigated structural surface, wherein a back lit grille is employed for casting a grille shadow on the surface which is viewed from behind the grille whereat fringes appear in relation to the out-of-plane displacement, the method for creating the grille comprising the steps:
    positioning a flexible strip of photoreproduction material against a flat surface;
    directing light through a master grille in optical alignment with the photoreproduction strip;
    focusing an enlarged master grille image on the photoreproduction strip, the enlarged image having a lesser line density than the master grille by a ratio corresponding to the ratio of enlargement;
    developing the enlarged grille image on the photoreproduction strip for utilization as a shadow Moire grille.

2. The method set forth in claim 1 together with the mounting of the developed grille comprising the steps:
    peripherally sealing edges of the strip to a transparent plate;
    mounting the sealed grille and plate in parallel relation to the investigated surface;
    maintaining a vacuum in the space between the strip and the plate so that contact is maintained therebetween thus retaining the parallel relation.

3. The method set forth in claim 2 wherein the strip is comprised of MYLAR material.

4. A method for fabricating a grille for use in creating shadow Moire images on a structural surface being investigated, the method comprising:
    positioning a flexible strip of photoreproduction material against a flat surface;
    directing light through a master grille in optical alignment with the photoreproduction strip;
    focusing an enlarged master grille image on the photoreproduction strip, the enlarged image having a lesser line density than the master grille by a ratio corresponding to the ratio of enlargement;
    developing the enlarged grille image on the photoreproduction strip;
    peripherally sealing edges of the strip to a transparent plate;
    mounting the sealed grille and plate in parallel relation to the investigated surface;
    maintaining a vacuum in the space between the strip and the plate so that contact is maintained therebetween thus retaining the parallel relation.

5. The method set forth in claim 4 wherein the strip is comprised of MYLAR material.

* * * * *